(12) United States Patent
Kano et al.

(10) Patent No.: US 7,939,453 B2
(45) Date of Patent: May 10, 2011

(54) METHOD FOR MANUFACTURING ORGANIC TRANSISTOR AND ORGANIC TRANSISTOR

(75) Inventors: Masataka Kano, Tokyo-to (JP);
Kazuhito Tsukagoshi, Saitama (JP);
Takeo Minari, Saitama (JP)

(73) Assignees: Dai Nippon Printing Co., Ltd., Tokyo-to (JP); Riken, Wako-shi, Saitama (JP)

( * ) Notice: Subject to any disclaimer, the term of this patent is extended or adjusted under 35 U.S.C. 154(b) by 129 days.

(21) Appl. No.: 12/393,416

(22) Filed: Feb. 26, 2009

(65) Prior Publication Data
US 2009/0256144 A1    Oct. 15, 2009

(30) Foreign Application Priority Data

Feb. 29, 2008   (JP) ................................. 2008-050715

(51) Int. Cl.
*H01L 21/302*    (2006.01)
*H01L 21/461*    (2006.01)

(52) U.S. Cl. ........ 438/725; 438/149; 438/642; 438/780; 257/E21.006; 257/E21.051; 257/E21.26; 257/E21.267; 257/E21.266; 257/E21.347

(58) Field of Classification Search .................. 438/149, 438/725, 30, 789, 790, 780, 795, 796, 798; 257/642, 643, E21.006, 51, 26, 266, 267, 257/347

See application file for complete search history.

(56) References Cited

U.S. PATENT DOCUMENTS

| 7,020,355 | B2 * | 3/2006 | Lahann et al. ................. 385/16 |
| 7,396,566 | B2 * | 7/2008 | Zschieschang et al. ....... 427/256 |
| 7,648,739 | B2 * | 1/2010 | Lahann et al. ................. 427/516 |
| 2010/0140597 | A1 * | 6/2010 | Babudri et al. ................. 257/40 |

OTHER PUBLICATIONS

Seungmoon Pyo, et al; "Low-temperature processable inherently photosensitive polyimide as a gate insulator for organic thin-film transistors" Applied Physics Letters 86, 133508 (2005).

* cited by examiner

*Primary Examiner* — David Nhu
(74) *Attorney, Agent, or Firm* — Ladas & Parry LLP

(57) ABSTRACT

A method of producing an organic transistor which can form directly an organic semiconductor layer in pattern by simple processes and can produce an organic transistor excellent in transistor characteristics. The method includes: forming a hydrophobic/hydrophilic pattern substrate, in which a hydrophobic/hydrophilic pattern substrate is formed by using a hydrophobic substrate and by forming the hydrophilic region in pattern on the hydrophobic surface; forming a lyophilic functional layer, in which a lyophilic functional layer, made of an insulating functional material having the predetermined characteristics and having higher lyophilic properties to an organic solvent than that of the hydrophobic region, is formed on the hydrophilic region; forming an organic semiconductor layer, in which an organic semiconductor layer is formed on the lyophilic functional layer by selectively coating a coating solution for forming an organic semiconductor layer, which has an organic semiconductor material and an organic solvent, to the lyophilic functional layer.

5 Claims, 9 Drawing Sheets

METHOD FOR MANUFACTURING ORGANIC TRANSISTOR AND ORGANIC TRANSISTOR

CROSS-REFERENCES TO RELATED APPLICATIONS

The present application claims priority to JP 2008-050715, which was filed on Feb. 29, 2008.

BACKGROUND OF THE INVENTION

1. Field of the Invention

The present invention relates to a method of producing an organic transistor which enables a simultaneous production of plural organic transistors, and an organic transistor which can be produced by the above-mentioned method of producing an organic transistor.

2. Description of the Related Art

A semiconductor transistor typified by TFT shows the current trend towards spreading of its applications along with the development of display devices. Such a semiconductor transistor functions as a switching element when the electrodes are connected through a semiconductor material.

As the semiconductor material used for the semiconductor transistor, inorganic semiconductor materials such as silicon (Si), gallium arsenic (GaAs) and indium gallium arsenic (InGaAs) have been used. Semiconductor transistors using such an inorganic semiconductor material are also used for display TFT array substrates of liquid crystal display devices which have been widely spread in recent years.

On the other hand, organic semiconductor materials made of organic compounds are known as the semiconductor material. Organic semiconductor materials. have an advantage in that: they are allowed to be increased in area at a lower cost than those using the inorganic semiconductor materials, and they can be formed on a flexible plastic substrate and are also stable against mechanical impact. Therefore, active studies are being made as to technologies regarding the organic semiconductor materials, which is assumed to be applied for display devices such as flexible displays typified by electronic papers in the next generation.

When producing an organic semiconductor transistor using an organic semiconductor material like this, it is usually necessary to form the organic semiconductor layer in pattern form. The vacuum deposition method using a metal mask has been mainly used to form an organic semiconductor layer in pattern form so far (for example, Seungmoon Pyo et al, "Low-temperature processable inherently photosensitive polyimide as a gate insulator for organic thin-film transistors" Appl. Phys. Lett. 86,133508 (2005)). The vacuum deposition method is superior in that a layer made of an organic semiconductor material can be patterned into a desired pattern with high accuracy. However, the vacuum deposition method has a problem of being poor in its productivity because vacuum conditions need to be fulfilled, a large amount of organic semiconductor materials adhered to a mask are wasted, and the like, so that its process is complicated and costly.

Therefore, there has been no method provided to directly form an organic semiconductor layer in pattern form by a simple method.

SUMMARY OF THE INVENTION

The present invention was achieved in view of the above-mentioned situation, and a main object thereof is to provide a method of producing an organic transistor which can form directly an organic semiconductor layer in pattern by simple processes and can produce an organic transistor excellent in transistor characteristics.

To solve the above-mentioned problems, the present invention provides a method of producing an organic transistor comprising steps of: forming a hydrophobic/hydrophilic pattern substrate, in which a hydrophobic/hydrophilic pattern substrate having a hydrophobic region and a hydrophilic region formed in pattern on a surface thereof is formed by using a hydrophobic substrate exhibiting hydrophobicity on a surface thereof and by forming the hydrophilic region in pattern on the hydrophobic surface; forming a lyophilic functional layer, in which a lyophilic functional layer, made of an insulating functional material and having higher lyophilic properties to an organic solvent than that of the hydrophobic region, is formed on the hydrophilic region; forming an organic semiconductor layer, in which an organic semiconductor layer made of an organic semiconductor material is formed on the lyophilic functional layer by selectively coating a coating solution for forming an organic semiconductor layer, which comprises an organic semiconductor material and an organic solvent, to the lyophilic functional layer, wherein the insulating functional material has a function of improving semiconductor characteristics of the organic semiconductor layer and a property enabling selective provision to the hydrophilic region in the step of forming a lyophilic functional layer.

In the present invention, as the step of forming a lyophilic functional layer is a step of forming a lyophilic functional layer, in which a lyophilic functional layer having higher lyophilic properties to an organic solvent than that of the hydrophobic region, on the hydrophilic region of the hydrophobic/hydrophilic pattern substrate produced in the step of forming a hydrophobic/hydrophilic pattern substrate, selective provision of the coating solution for forming an organic semiconductor layer comprising an organic solvent to the lyophilic functional layer in the step of forming an organic semiconductor layer becomes very easy. Thereby, in the present invention, an organic semiconductor layer in pattern can be produced by a very simple method. For example, it is possible to produce an organic semiconductor layer on a lyophilic functional layer by simply immersing a hydrophobic/hydrophilic pattern substrate having the lyophilic functional layer formed into the coating solution for forming an organic semiconductor layer.

In the step of forming an organic semiconductor layer, the organic semiconductor layer is selectively formed on each of the lyophilic functional layer, and the insulating functional material used for the lyophilic functional layer has a function of improving semiconductor characteristics of the organic semiconductor layer. Thereby, an organic transistor excellent in transistor characteristics can be produced in the present invention by the action of the lyophilic functional layer to the organic semiconductor layer.

Further, as the insulating functional material has properties enabling selective provision to the hydrophilic region in the step of forming a lyophilic functional layer, it becomes very easy to form the lyophilic functional layer only to the hydrophilic region of the hydrophobic/hydrophilic pattern substrate in the step of forming a lyophilic functional layer.

Accordingly, the present invention provides a method of producing an organic transistor which can form directly an organic semiconductor layer in pattern by simple processes and can produce an organic transistor excellent in transistor characteristics.

In the present invention, the step of forming an organic semiconductor layer is preferably a step of: coating the coating solution for forming an organic semiconductor layer to the hydrophobic/hydrophilic pattern substrate having the hydrophobic region and the lyophilic functional layer formed, and forming the organic semiconductor layer on the lyophilic functional layer by utilizing a difference in affinity to an organic solvent between the hydrophobic region and the lyophilic functional layer.

In the present invention, the hydrophobic substrate preferably comprises: a hydrophilic substrate exhibiting hydrophilicity on a surface thereof, and a hydrophobic layer formed on the hydrophilic substrate and made of a self-assembled monolayer exhibiting hydrophobicity, and the step of forming a hydrophobic/hydrophilic pattern substrate is preferably a step of removing the hydrophobic layer in pattern and exposing the hydrophilic substrate surface in pattern. As the hydrophobic layer made of a self-assembled monolayer can be easily removed by means such as an ultraviolet irradiation, production of a hydrophobic/hydrophilic pattern substrate having a highly-precise hydrophobic/hydrophilic pattern in the step of forming a hydrophobic/hydrophilic pattern substrate can be made possible.

Further, in the present invention, the insulating functional material preferably has a function of improving crystal properties of the organic semiconductor material contained in the organic semiconductor layer. As the insulating functional material has such function, the organic transistor produced by the present invention can be a highly-reliable organic transistor even when the transistor is either of a top gate type structure or a bottom gate type structure. As the insulating functional material has such function, the organic transistor produced by the present invention can be a highly-reliable organic transistor even when the transistor is either of a top gate type structure or a bottom gate type structure.

The present invention further provides an organic transistor comprising: a hydrophobic/hydrophilic pattern substrate having a hydrophobic region and a hydrophilic region formed in pattern on a surface thereof, a lyophilic functional layer, made of an insulating functional material and having higher lyophilic properties to an organic solvent than that of the hydrophobic region, formed on the hydrophilic region, and an organic semiconductor layer made of an organic semiconductor material formed on the lyophilic functional layer, wherein the insulating functional material has a function of improving semiconductor characteristics of the organic semiconductor layer and a property enabling selective provision to the hydrophilic region of the hydrophobic/hydrophilic pattern substrate.

In the present invention, as the organic semiconductor layer is formed on the lyophilic functional layer in pattern and the insulating functional material used for the lyophilic functional layer has a function of improving semiconductor characteristics of the organic semiconductor layer, an organic transistor excellent in transistor characteristics can be obtained resulting from the action of the lyophilic functional layer to the organic semiconductor layer.

Further, as the lyophilic functional layer has higher lyophilic properties to an organic solvent than that of the hydrophobic region of the hydrophobic/hydrophilic pattern substrate, an organic semiconductor layer can be selectively formed on the lyophilic functional layer when producing an organic transistor of the present invention. Still further, as the insulating functional material used for the lyophilic functional layer has properties enabling selective provision to the hydrophilic region of the hydrophobic/hydrophilic pattern substrate, it becomes easy to form the lyophilic functional layer only to the hydrophilic region when producing the organic transistor or the present invention. Thereby, an organic transistor excellent in transistor characteristics and which can be produced by simple processes is obtained in the present invention.

The method of producing an organic transistor of the present invention attains effects of enabling a direct formation of an organic semiconductor layer by simple processes and of producing an organic transistor excellent in transistor characteristics.

DESCRIPTION OF THE PREFERRED EMBODIMENT

Figure 1A:
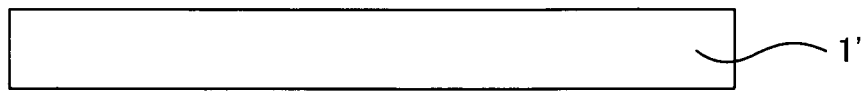
FIGS. 1A to 1E is a schematic view showing an embodiment of the method of producing an organic transistor of the present invention.
Figure 1B:
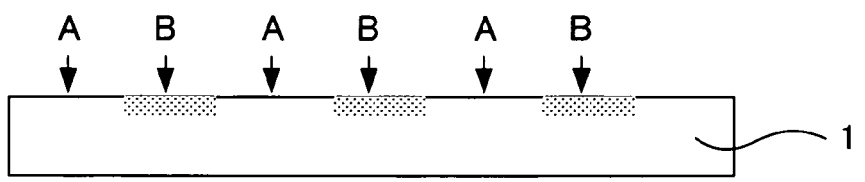

The present invention relates to a method of producing an organic transistor and an organic transistor obtained therefrom.

Hereinafter, the method of producing an organic transistor of the present invention and the organic transistor obtained therefrom will be described in turn.

A. Method of Producing an Organic Transistor

First, a method of producing an organic transistor of the present invention will be explained. As mentioned above, the method of producing an organic transistor of the present invention comprises steps of: forming a hydrophobic/hydrophilic pattern substrate, in which a hydrophobic/hydrophilic pattern substrate having a hydrophobic region and a hydrophilic region formed in pattern on a surface thereof is formed by using a hydrophobic substrate exhibiting hydrophobicity on a surface thereof and by forming the hydrophilic region in pattern on the hydrophobic surface; forming a lyophilic functional layer, in which a lyophilic functional layer, made of an insulating functional material and having higher lyophilic properties to an organic solvent than that of the hydrophobic region, is formed on the hydrophilic region; forming an organic semiconductor layer, in which an organic semiconductor layer made of an organic semiconductor material is formed on the lyophilic functional layer by selectively coating a coating solution for forming an organic semiconductor layer, which comprises an organic semiconductor material and an organic solvent, to the lyophilic functional layer, wherein the insulating functional material has a function of improving semiconductor characteristics of the organic semiconductor layer and properties enabling selective provision to the hydrophilic region in the step of forming a lyophilic functional layer.

Such method of producing an organic transistor of the present invention will be explained with reference to the drawings. FIGS. 1A to 1E is a schematic view illustrating one embodiment of the method of producing an organic transistor of the present invention. As shown in FIGS. 1A to 1E, the method of producing an organic transistor of the present invention comprises steps of: forming a hydrophobic/hydrophilic pattern substrate (FIG. 1B), in which a hydrophobic/hydrophilic pattern substrate 1 having a hydrophobic region A and a hydrophilic region B formed in pattern on the surface of thereof is formed by using a hydrophobic substrate 1' exhibiting hydrophobicity (FIG. 1A) and by forming the hydrophilic region A in pattern on the hydrophobic surface; forming a lyophilic functional layer (FIG. 1C), in which a lyophilic functional layer 2, made of an insulating functional material and having higher lyophilic properties to an organic solvent than that of the hydrophobic region A, is formed on the hydrophilic region B of the hydrophobic/hydrophilic pattern substrate 1; forming an organic semiconductor layer (FIG. 1D), in which an organic semiconductor layer 3 made of an organic semiconductor material is formed on the lyophilic functional layer 2 by selectively coating a coating solution for forming an organic semiconductor layer, which comprises an organic semiconductor material and an organic solvent, to the lyophilic functional layer 2. The method is to produce an organic transistor 10 comprising the lyophilic functional layer 2 formed in pattern on the hydrophobic/hydrophilic pattern substrate 1 and the organic semiconductor layer 3 formed only on the lyophilic functional layer 2.

Figure 1C:
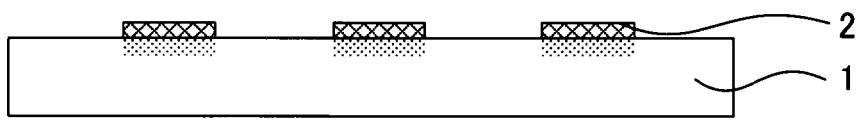
Figure 1D:
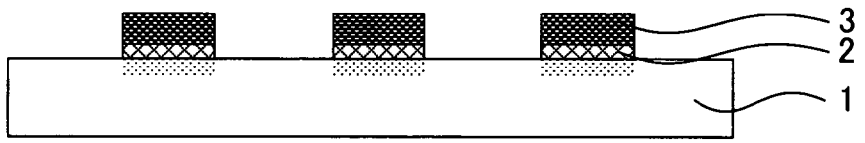
Figure 1E:
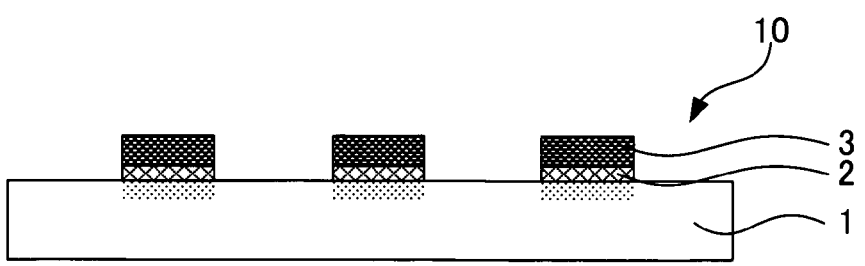

In such embodiment, the method of producing an organic transistor of the present invention is characterized in that the insulating functional material used for the lyophilic functional layer 2 has a function of improving semiconductor characteristics of the organic semiconductor layer 3 formed on the lyophilic functional layer 2, and further has properties enabling selective provision to the hydrophilic region B in the step of forming a lyophilic functional layer (FIG. 1C).

In the present invention, as the step of forming a lyophilic functional layer is a step of forming a lyophilic functional layer, in which a lyophilic functional layer having higher lyophilic properties to an organic solvent than that of the hydrophobic region is formed on the hydrophilic region of the hydrophobic/hydrophilic pattern substrate produced in the step of forming a hydrophobic/hydrophilic pattern substrate, selective provision of the coating solution for forming an organic semiconductor layer comprising an organic solvent to the lyophilic functional layer in the step of forming an organic semiconductor layer becomes very easy. Thereby, in the present invention, an organic semiconductor layer in pattern can be produced by a very simple method. For example, it is possible to produce an organic semiconductor layer on a lyophilic functional layer by simply immersing a hydrophobic/hydrophilic pattern substrate having the lyophilic functional layer formed into the coating solution for forming an organic semiconductor layer.

In the step of forming an organic semiconductor layer, the organic semiconductor layer is selectively formed on each of the lyophilic functional layer, and the insulating functional material used for the lyophilic functional layer has a function of improving semiconductor characteristics of the organic semiconductor layer. Thereby, a highly-reliable organic transistor can be produced in the present invention by the action of the lyophilic functional layer to the organic semiconductor layer.

Further, as the insulating functional material has properties enabling selective provision to the hydrophilic region in the step of forming a lyophilic functional layer, it becomes very easy to form the lyophilic functional layer only to the hydrophilic region of the hydrophobic/hydrophilic pattern substrate in the step of forming a lyophilic functional layer.

Accordingly, in the method of producing an organic transistor of the present invention, it is possible to form directly an organic semiconductor layer by simple processes and to produce a highly reliable organic transistor.

The method of producing an organic transistor of the present invention comprises at least the step of forming a hydrophobic/hydrophilic pattern substrate, the step of forming a lyophilic functional layer and the step of forming an organic semiconductor layer, and may comprise other optional step as needed.

Hereinafter, each step comprised in the producing method of the present invention will be explained in turn.

1. Step of Forming a Hydrophobic/Hydrophilic Pattern Substrate

First, the step of forming a hydrophobic/hydrophilic pattern substrate will be explained. The present step is a step of forming a hydrophobic/hydrophilic pattern substrate, in which a hydrophobic/hydrophilic pattern substrate having a hydrophobic region and a hydrophilic region formed in pattern on a surface thereof is formed by using a hydrophobic substrate exhibiting hydrophobicity on a surface thereof and by forming the hydrophilic region in pattern on the hydrophobic surface.

(1) Hydrophobic Substrate

The hydrophobic substrate used in the present step is not particularly limited as long as the surface thereof exhibits the desired hydrophobicity and which can form a hydrophilic region in pattern on the hydrophobic surface.

Here, the "hydrophobicity" used in the present invention means a state where a contact angle to water at 25° C. is 40° or larger. The hydrophobicity which the hydrophobic substrate used in the present step has is preferably a state where a contact angle to water at 25° C. is 40° or larger, more preferably 70° or larger, and even more preferably 80° or larger. The contact angle in the present invention can be measured by, for example, dropping a liquid of 1 microliter to a substrate, observing the shape of the dropped droplet from the side and measuring an angle made from the droplet and the substrate. In measuring, a device such as a contact angle measuring device manufactured by IMOTO MACHINERY CO., LTD. can be used.

A structure of the hydrophobic substrate used in the present step is not particularly limited as long as the surface exhibits the desired hydrophobicity and which can form a hydrophilic region in pattern. A hydrophobic substrate having an optional structure can be used according to factors such as a degree in hydrophilicity of the hydrophilic region formed in the present step or the pattern of the hydrophilic region formed in the present step. Among them, as a hydrophobic substrate suitably used in the present step, a substrate made of a hydrophobic material which can be provided with hydrophilicity by conducting the predetermined hydrophilic treatment (hydrophobic substrate of first embodiment), and a substrate comprising a hydrophilic substrate which exhibits hydrophilicity on its surface and a hydrophobic layer formed on the hydrophilic substrate which exhibits hydrophobicity (hydrophobic substrate of second embodiment) can be cited.

Hereinafter, the hydrophobic substrate of each embodiment will be explained in detail.

Hydrophobic Substrate of First Embodiment

First, a hydrophobic substrate of the first embodiment will be explained. The hydrophobic substrate of the present embodiment is not particularly limited as long as the substrate is made of a hydrophobic material which can be provided with hydrophilicity by conducting the predetermined hydrophilic treatment. Such hydrophobic material may be an organic material or an inorganic material. As the hydrophobic material used for the hydrophobic. substrate of the present embodiment, materials such as polyimide, polyester, polyethylene, polyphenylene sulfide, polyparaxylene, polyethylene terephthalate, polyethylene naphthalate, and polydimethylsiloxane can be cited. Any of these hydrophobic materials can be used in the present embodiment. Further, only a hydrophobic material of a single kind, or alternatively, hydrophobic materials of plural kinds may be used.

As a thickness of the hydrophobic substrate of the present embodiment, it is not particularly limited as long as the thickness is within such a range that desired properties such as self supporting properties or flexibility can be provided to the hydrophobic substrate according to factors such as the application of an organic transistor to be produced in the present invention. Among them, the thickness of the hydrophobic substrate of the present embodiment is preferably within 1 μm to 5 mm, more preferably within the range of 10 μm to 1.5 mm, and even more preferably within the range of 25 μm to 1.0 mm.

Hydrophobic Substrate of Second Embodiment

Next, a hydrophobic substrate of the second embodiment will be explained. The hydrophobic substrate of the present embodiment is a substrate comprising a hydrophilic substrate which exhibits hydrophilicity on its surface and a hydrophobic layer formed on the hydrophilic substrate which exhibits hydrophobicity on its surface.
(Hydrophilic Substrate)

The hydrophilic substrate used in the present embodiment is not particularly limited as long as the surface thereof exhibits the desired hydrophilicity. Here, "hydrophilicity" means a state where a contact angle to water at 25° C. is 40 ° or smaller. The hydrophilicity which the hydrophilic substrate used in the present step is preferably a state where a contact angle to water at 25° C. is 40° or smaller, more preferably 30° or smaller, and even more preferably 20° or smaller.

A material constituting the hydrophilic substrate used for the present embodiment (hereinafter, "hydrophilic material") is not particularly limited as long as a hydrophilic substrate exhibiting the desired hydrophilicity can be produced. Thus, the hydrophilic material may be an inorganic material or an organic material. As the hydrophilic material, materials such as a glass, $SiO_2$, SiN, SiON, and the above-mentioned hydrophobic substrate made of polyimide, polyester, polyethylene, polyphenylene sulfide or polyparaxylene which is hydrophilic-treated by irradiating ultraviolet rays, electron beam, laser and the like, can be cited. In the present embodiment, a hydrophilic substrate made of any of these hydrophilic materials can be suitably used. Among them, the above-mentioned hydrophobic substrate which is hydrophilic-treated by irradiating ultraviolet rays, electron beam, laser and the like is preferably used.

As a thickness of the hydrophilic substrate of the present embodiment, it is not particularly limited as long as the thickness is within such a range that desired properties such as self supporting properties or flexibility can be provided to the hydrophilic substrate according to factors such as the application of an organic transistor to be produced in the present invention. Among them, the thickness of the hydrophilic substrate of the present embodiment is preferably within 1 μm to 5 mm, more preferably within the range of 10 μm to 1.5 mm, and even more preferably within the range of 25 μm to 1.0 mm.
(Hydrophobic Layer)

A hydrophobic layer used in the present embodiment is not particularly limited as long as the substrate can be provided with the desired hydrophobicity to the surface of the hydrophobic substrate of the present embodiment by being formed on the hydrophilic substrate. Among them, the hydrophobic layer used in the present invention preferably has a contact angle to surface water at 25° C. of 40° or larger, more preferably of 70° or larger, and even more preferably of 80° or larger.

The hydrophobic layer used in the present embodiment is not particularly limited as long as it has the above-mentioned hydrophobicity. In particular, it is preferably be a layer which can be removed in pattern in the present step. As explained above, since the hydrophobic layer is formed on the hydrophilic substrate, the hydrophilic substrate surface can be exposed in pattern by removing the hydrophobic layer in pattern and thereby a hydrophobic/hydrophilic pattern substrate can be produced. In view of this perspective, the hydrophobic layer used in the present embodiment is preferably a self-assembled monolayer made of a self-assembled monolayer material. By the hydrophobic layer being made of a self-assembled monolayer, removal of the hydrophobic layer in highly-precise pattern in the present step is made easy.

A self-assembled monolayer material used in the present embodiment is not particularly limited as long as the material can form a hydrophobic layer made of a self-assembled monolayer which has the desired hydrophobicity on its surface. As such self-assembled monolayer material, for example, HMDS (hexamethyldisilazane), OTS (octyltrichlorosilane), ODTS (octadecyltrichlorosilane), FAS (fluorinatedalkylsilane), alkyltrimethoxysilane, and alkyltriethoxysilane can be cited. In the present embodiment, any of these self-assembled monolayer materials may be used suitably. Among them, HMDS (hexamethyldisilazane), OTS (octyltrichlorosilane), and ODTS (octadecyltrichlorosilane) are preferably used.

A thickness of the hydrophobic layer used in the present embodiment can be decided arbitrarily according to factors such as a material used to form the hydrophobic layer. However, as the hydrophobic substrate of the present embodiment enables a preparation of a hydrophobic/hydrophilic pattern substrate by removing the hydrophobic layer in pattern, the thickness of the hydrophobic layer is preferably a thickness which allows the layer to be easily removed in pattern. In view of such perspective, the thickness of the hydrophobic layer of the present embodiment is preferably within 0.1 nm to 1 μm, more preferably within the range of 0.1 nm to 100 nm, and even more preferably within the range of 0.1 nm to 10 nm.

Other Structure

The hydrophobic substrate used in the present step may have a gate electrode and a gate insulating layer, or a source electrode and a drain electrode formed according to the structure of an organic transistor produced by the present invention. Further, when the gate insulating layer is formed and the gate insulating layer surface itself exhibits hydrophobicity, a hydrophobic/hydrophilic pattern substrate may be produced by conducting a hydrophilic treatment to the gate insulating layer surface.
(2) Method of Forming a Hydrophilic Region Next, a method of preparing a hydrophobic/hydrophilic pattern substrate in the present step which uses the hydrophobic substrate will be explained. In the present step, a hydrophobic/hydrophilic pattern substrate having a hydrophilic region and a hydrophobic region formed in pattern on the surface thereof is formed by using a hydrophobic substrate and by forming the hydrophilic region on the hydrophobic substrate surface. Therefore, the "hydrophilic region" means a region to where hydrophilicity is provided in the present step, and the "hydrophobic region" means a region to where hydrophilicity is not provided in the present step so that the hydrophobic surface of the hydrophobic substrate is exhibited.

Here, the "hydrophilicity" of the present invention means a state where a contact angle to water at 25° C. is 40° or smaller. The above-mentioned hydrophilic region means a region which exhibits such hydrophilicity.

A method of preparing a hydrophilic region in pattern on the hydrophobic surface of the hydrophobic substrate of the present step is not particularly limited and arbitrarily determined according to factors such as an embodiment of the hydrophobic substrate, degree in hydrophilicity provided in the hydrophilic region, or a pattern shape of the hydrophilic region. Among them, the forming method of the hydrophilic region of the present step is preferably a method which enhances the degree in hydrophilicity of the hydrophilic region. Specifically, the method is preferably a method which can make a difference in contact angles at 25° C. between the hydrophilic region and the hydrophobic region to 10° or larger, more preferably to 40° or larger, and even more preferably to 80° or larger. By making a difference in contact angles between the hydrophilic region formed in the present step and the hydrophobic region to such range, it becomes easy to form a lyophilic functional layer only onto the hydrophilic region in the step of forming a lyophilic functional layer to be explained later. In other words, the step of forming a lyophilic functional layer to be explained layer is a step of forming a lyophilic functional layer on the hydrophilic region by utilizing the difference in degree in hydrophilicity (hydrophobicity) between the hydrophilic region and the hydrophobic region, and by making the difference in contact angles between the hydrophilic region and the hydrophobic region to the above-mentioned range, forming of the lyophilic functional layer on the hydrophobic region in the step of forming a lyophilic functional layer can be prevented effectively. As a result, it becomes easy to selectively form the lyophilic functional layer onto the hydrophilic region.

Further, the method of forming a hydrophilic region of the present step is a method which can make a contact angle to water of the hydrophilic region to be formed at 25° C. is preferably 40° or smaller, more preferably 30° or smaller, and even more preferably 20° or smaller. By making the contact angle of the hydrophilic region to water within the above-mentioned range, the insulating functional material can be provided to the hydrophilic region more selectively in the step of forming a lyophilic functional layer to be explained later so that a lyophilic functional layer can be formed at high pattern precision.

As the method of forming the hydrophilic region in pattern in the present step, a method of conducting hydrophilic treatment in pattern on the hydrophobic substrate surface can be cited when the hydrophobic substrate of the first embodiment is used as a hydrophobic substrate. Further, a method of removing the hydrophobic layer in pattern and exposing the hydrophilic substrate surface in pattern can be cited when the hydrophobic substrate of the second embodiment is used as a hydrophobic substrate.

Figure 2A:
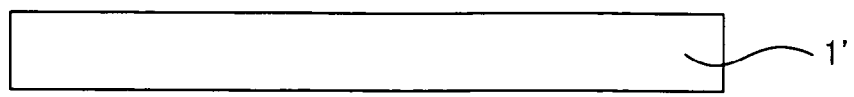
FIGS. 2A to 2C is a schematic view showing an embodiment of a step of forming a hydrophobic/hydrophilic pattern substrate of the present invention.
Figure 2B:
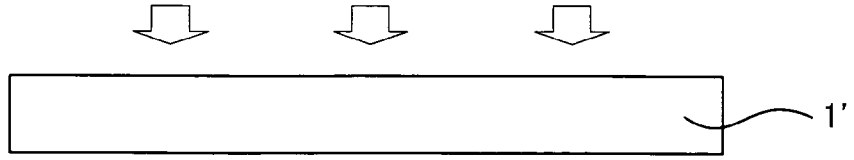
Figure 2C:

These forming methods of hydrophilic regions will be explained with reference to the drawings. FIGS. 2 and 3 are schematic views respectively illustrating an embodiment of the method of forming a hydrophilic region on the hydrophobic substrate surface in the present step. As shown in FIGS. 2A to 2C, as a method of forming the hydrophilic region in pattern in the present step, the following method can be cited: using the hydrophobic substrate 1'$a$ of the first embodiment as a hydrophobic substrate (FIG. 2A), conducting hydrophilic treatment in pattern to the surface of the hydrophobic substrate 1' (FIG. 2B), and thereby forming the hydrophilic region in pattern on the surface (FIG. 2C).

Figure 3A:
FIGS. 3A to 3C is a schematic view showing another embodiment of a step of forming a hydrophobic/hydrophilic pattern substrate of the present invention.
Figure 3B:
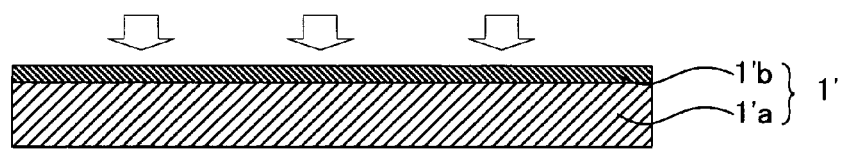
Figure 3C:
Figure 4A:
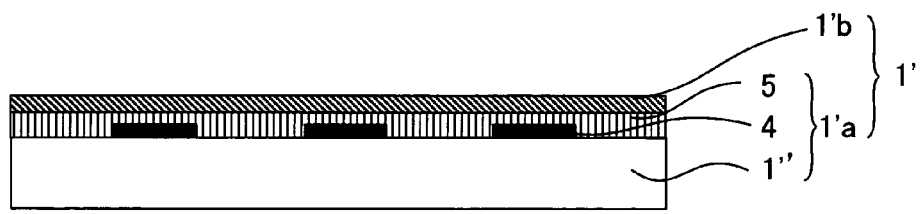
FIGS. 4A to 4E is a schematic view showing another embodiment of the method of producing an organic transistor of the present invention.
Figure 4B:
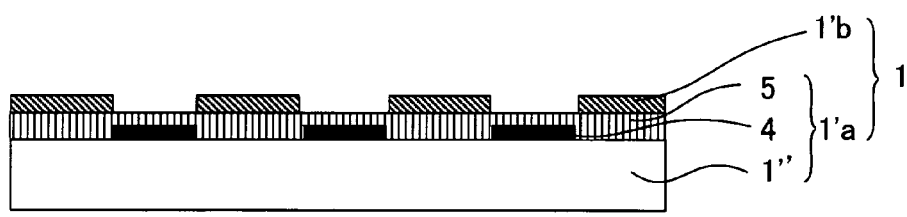
Figure 4C:
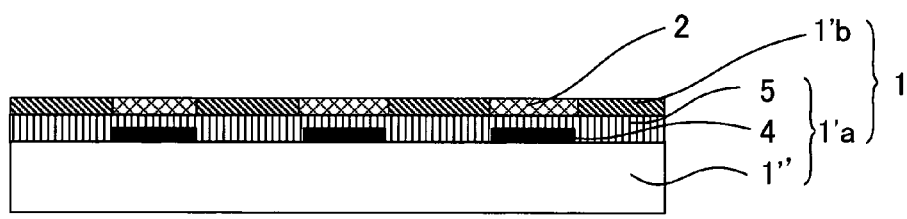
Figure 4D:
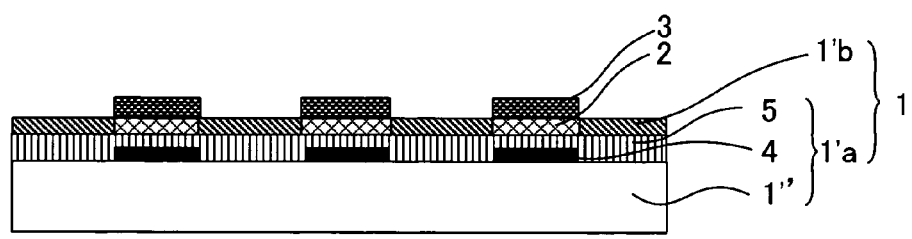
Figure 4E:
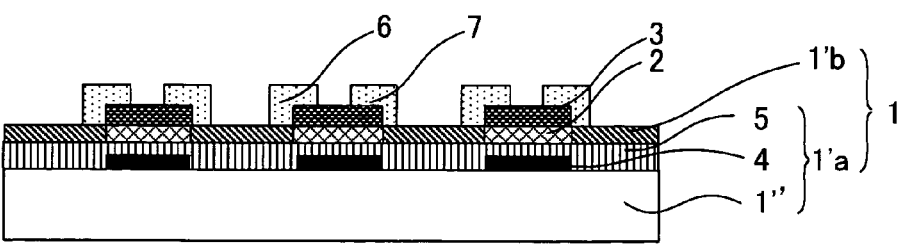
Figure 5A:
FIGS. 5A to 5G is a schematic view showing yet another embodiment of the organic transistor of the present invention.
Figure 5B:
Figure 5C:
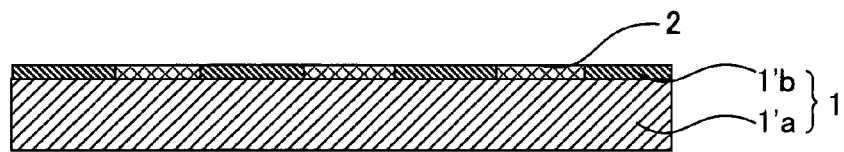
Figure 5D:
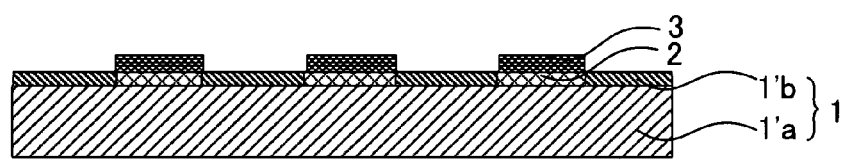
Figure 5E:
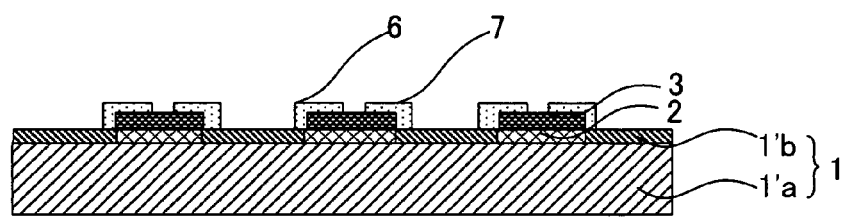
Figure 5F:
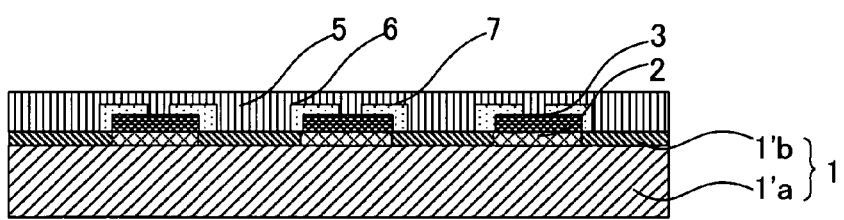
Figure 5G:
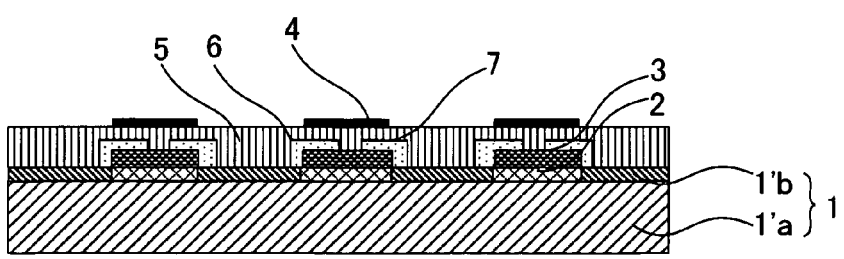

Moreover, as shown in FIGS. 3A to 3C, the following method can be cited: using the hydrophobic substrate 1' of the second embodiment as a hydrophobic substrate which comprises the hydrophilic substrate 1'$a$ and the hydrophobic layer 1'$b$ formed on the hydrophilic substrate 1'$a$ (FIG. 3A), conducting pattern treatment to the hydrophobic layer 1'$b$ (FIG. 3B), and removing the hydrophobic layer 1'$b$ of the hydrophobic substrate 1' in pattern and thereby exposing the hydrophilic substrate 1'$a$ surface in pattern (FIG. 3C).

When the hydrophobic substrate of the first embodiment is used, the method of conducting hydrophilic treatment to the hydrophobic substrate surface is not particularly limited as long as the method is a treating method which can form a hydrophilic region having the desired hydrophilicity according to factors such as the type of hydrophobic material constituting the hydrophobic substrate. As such methods, for example, a method of irradiating ultraviolet, electron beam or laser to the hydrophobic substrate surface via a photomask, and a method of directly irradiating in pattern an active radiation such as ultraviolet to the hydrophobic substrate surface can be cited. For example, when the hydrophobic material used in the hydrophobic substrate is a material having properties of generating an OH group by being irradiated with ultraviolet or the like and thereby partially decomposed, pattern irradiation of ultraviolet to the hydrophobic substrate surface will generate an OH group on the surface thereof and the hydrophilic-treated hydrophilic region can be formed.

Further, when the hydrophobic substrate of the second embodiment is used, the method of removing the hydrophobic layer in pattern and thereby exhibiting the hydrophilic substrate surface is not particularly limited as long as the method can remove the hydrophobic layer according to the structure of the hydrophobic layer. However, in this method, as the hydrophilic region is to be formed by exposing the hydrophilic substrate surface, the method of removing the hydrophobic layer in the present step is preferably a method which can almost completely remove the hydrophobic layer. As such methods, for example, a method of irradiating ultraviolet to the hydrophobic substrate surface via a photomask to thereby decompose and remove the hydrophobic layer, and a method of irradiating in pattern an active radiation such as ultraviolet, electron beam or plasma to the hydrophobic layer surface to thereby decompose and remove the hydrophobic layer can be cited.

(3) Preparation of Hydrophobic/Hydrophilic Pattern Substrate

As a method of preparing a hydrophobic/hydrophilic pattern substrate in the present step, as explained above, a method of using the hydrophobic substrate of the first embodiment and conducting hydrophilic treatment in pattern to the hydrophobic substrate surface, and a method of using the hydrophobic substrate of the second embodiment and removing in pattern the hydrophobic layer of the hydrophobic substrate can be cited. Either of the above is suitable in the present step, and it is preferable to use the latter method. In particular, it is preferable to use the hydrophobic layer made of self-assembled monolayer as the hydrophobic substrate of the second embodiment and to remove hydrophobic layer made of self-assembled monolayer in pattern. As the hydrophobic layer made of a self-assembled monolayer can be easily removed in pattern by means such a ultraviolet irradiation, preparation of a hydrophobic/hydrophilic pattern substrate having a highly-precise hydrophobic/hydrophilic pattern in the step of forming a hydrophobic/hydrophilic pattern substrate can be made possible.

Further, the hydrophilic region pattern of the hydrophobic/hydrophilic pattern substrate produced in the present step is not particularly limited, and an optional pattern can be made according to factors such as an application of an organic transistor produced in the present invention or a structure of the transistor.

2. Step of Forming a Lyophilic Functional Layer

Next, a step of forming a lyophilic functional layer of the present invention will be explained. The present step is a step of forming a lyophilic functional layer, made of an insulating functional material and having higher lyophilic properties to an organic solvent than that of the hydrophobic region, on the hydrophilic region of the hydrophobic/hydrophilic pattern substrate produced in the step of forming a hydrophobic/hydrophilic pattern substrate. The present step is characterized in that the insulating functional material has: a function of improving semiconductor characteristics of the organic semiconductor layer formed in the step of forming an organic semiconductor layer which is to be explained later; and properties enabling selective provision to the hydrophilic region in the above-mentioned step.

Hereinafter, the step of forming a lyophilic functional layer will be explained in detail.

(1) Insulating Functional Material

First, an insulating functional material used in the present step will be explained. The insulating functional material used in the present step has at least the following characteristics.

Firstly, the insulating functional material used in the present step has a function of improving semiconductor characteristics of the organic semiconductor layer formed in the step of forming an organic semiconductor layer to be explained later (hereinafter, may referred simply as "semiconductor functionality"). An organic transistor produced by the present invention comprises the structure wherein the organic semiconductor layer is directly formed on the lyophilic functional layer formed in the present step. By the insulating functional material has the semiconductor functionality and by the action of the lyophilic functional layer to the organic semiconductor layer, the present invention can attain an effect of producing an organic transistor having better transistor characteristics. Here, as the above-mentioned semiconductor functionality, followings are cited: for example, when the organic semiconductor layer is formed on the lyophilic functional layer obtained in the present step, properties to improve crystal properties of the organic semiconductor material contained in the organic semiconductor layer, or properties to prevent adsorption of moistures to the lyophilic functional layer surface and thereby improve electric conduction of the organic semiconductor layer and reliability of an organic transistor. More specifically, improvements in, such as electric conduction, performance stability, bias stress characteristics, mobility, and on-off ratio can be cited.

Secondly, the insulating functional material used in the present step has properties of being selectively provided to the hydrophilic region of the hydrophobic/hydrophilic pattern substrate used in the present step (hereinafter, may simply referred as "region selectivity"). As the insulating functional material has such properties, it becomes possible to selectively form the lyophilic functional layer only to the hydrophilic region among the hydrophilic region and hydrophobic region formed on the hydrophobic/hydrophilic pattern substrate used in the present step. As a result, the present invention attains an effect of easily forming the lyophilic functional layer in pattern.

Thirdly, the insulating functional material used in the present step has properties of being able to form a lyophilic functional layer having higher lyophilic properties to an organic solvent than that of the hydrophobic region of the hydrophobic/hydrophilic pattern substrate used in the present step (hereinafter, may simply referred as "lyophilicity"). Thereby, the organic semiconductor layer can be selectively formed on the lyophilic functional layer in the step of forming an organic semiconductor layer to be explained later. As a result, the present invention attains an effect of easily forming the organic semiconductor layer in pattern. The "lyophilicity" means a state where the subject has high affinity to an organic solvent. The organic solvent mainly means an organic solvent used as a solvent of the coating solution for forming an organic semiconductor layer used in the step of forming an organic semiconductor layer to be explained later.

As explained, the insulating functional material used in the present step has at least three properties of the above-mentioned semiconductor functionality, region selectivity, and lyophilicity. The insulating functional material used in the present step is not particularly limited as long as it has at least these properties. An embodiment where the organic semiconductor layer functional material used in the present step has these characteristics is not particularly limited and can be optionally selected according to factors such as degrees of the above-mentioned semiconductor functionality, region selectivity and lyophilicity. As such embodiments, followings can be cited as examples: an embodiment where the insulating functional material has a structure in which functional groups showing the semiconductor functionality, region selectivity and lyophilicity are separately bonded to an optional skeleton, an embodiment where the insulating functional material has a structure in which a functional group showing the semiconductor functionality and lyophilicity and a functional group showing the region selectivity are bonded to an optional skeleton, and an embodiment where the insulating functional material has a structure in which a functional group showing the region selectivity is bonded to a molecular skeleton showing the semiconductor functionality and lyophilicity.

The insulating functional material used in the present step can be divided to a high-molecular type insulating functional material made of a high-molecular compound and a low-molecular type insulating functional material made of a low-molecular compound. Here, as the high-molecular type insulating functional material used in the present step, polyimide, polyvinylphenol, polyvinylalcohol, polymethylmethacrylate, and polystyrene can be cited for example. In the present step, either of the high-molecular type insulating functional material and the low-molecular type insulating functional material may suitably used. By using such an insulating functional material, it becomes easy to form the lyophilic functional layer made of a self-assembled monolayer on the hydrophilic region of the hydrophobic/hydrophilic pattern substrate in the present step. Further, among the material which can form such self-assembled monolayer, a material having an aromatic substituent is preferably used. While a self-assembled monolayer having aromaticity has high lyophilicity to an organic solvent, it also has high hydrophobicity so that it prevents adsorption of water molecule to the surface.

Thus, it can improve conductive characteristics and reliability of an organic transistor to be produced in the present step.

As examples of the low-molecular type insulating functional material used in the present step which can form an self-assembled monolayer, PhTS (β-phenethyltrichlorosilane), PTS (phenyltrichlorosilane), phenyltrimethoxysilane, phenyltriethoxysilane, phenethyltrimethoxysilane, and phenethyltriethoxysilane can be cited. In the present step, any of the above low-molecular type insulating functional materials is suitably used and among them, PhTS (β-phenethyltrichlorosilane) is suitable.

The insulating functional material used in the present step may be a single kind or plural kinds.

(2) Method of Forming a Lyophilic Functional Layer

Next, a method of forming a lyophilic functional layer in the present step will be explained. The present step is a step of forming a lyophilic functional layer, which is made of the insulating functional material, on the hydrophilic region of the hydrophobic/hydrophilic pattern substrate. Thus, the method of forming a lyophilic functional layer of the present step is not particularly limited as long as the lyophilic functional layer can be selectively formed on the hydrophilic region of the hydrophobic/hydrophilic pattern substrate. In particular, a method of coating to the hydrophobic/hydrophilic pattern substrate with a coating solution for forming a lyophilic functional layer produced by dissolving/dispersing the insulating functional material into an optional solvent, is generally used.

In the present step, a method of coating the coating solution for forming a lyophilic functional layer to the hydrophobic/hydrophilic pattern substrate is not particularly limited as long as a coating layer of the coating solution for forming a lyophilic functional layer is formed on the hydrophilic region of the hydrophobic/hydrophilic pattern substrate. As such a method, a method such as an ink jet method, in which a coating solution is pattern coated directly, can be used. However, since the insulating functional material used in the present step has the above-mentioned region selectivity, even if the coating solution for forming a lyophilic functional layer is coated to the entire surface of the hydrophobic/hydrophilic pattern substrate, it is still possible to form a coating layer of the coating solution for forming a lyophilic functional layer on the hydrophilic region by the action of the region selectivity. Thus, a method of coating the coating solution for forming a lyophilic functional layer in the present step is preferably a method to coat the coating solution to the entire surface of the hydrophobic/hydrophilic pattern substrate. As such coating method, general coating method such as a spin coating, a dye coating, a roll coating, a bar coating, a dip coating, a spray coating, a blade coating and gravure offset printing method can be used.

A thickness of the lyophilic functional layer formed in the present step is not particularly limited as long as it allows the organic semiconductor layer to be formed on the lyophilic functional layer in the step of forming an organic semiconductor layer to be explained later. In particular, a thickness of the lyophilic functional layer formed in the present step is preferably within the range of 0.1 nm to 1 μm, more preferably within the range of 0.1 nm to 100 nm, and even more preferably within the range of 0.1 nm to 30 nm.

3. Step of Forming an Organic Semiconductor Layer

Next, a step of forming an organic semiconductor layer used in the present invention will be explained. The present step is a step of forming an organic semiconductor layer made of an organic semiconductor material on the lyophilic functional layer by using a coating solution for forming an organic semiconductor layer comprising an organic semiconductor material and an organic solvent and selectively coating the coating solution for forming an organic semiconductor layer to the lyophilic functional layer.

Hereinafter, such step of forming an organic semiconductor layer will be explained in detail.

(1) Coating Solution for Forming an Organic Semiconductor Layer

The coating solution for forming an organic semiconductor layer used in the present step is either a coating solution comprising a low-molecular type organic semiconductor material and an organic solvent which disperse/decompose the same, or a coating solution comprising a high-molecular type organic semiconductor material. An organic semiconductor material used in the present step is not particularly limited as long as the material can form an organic semiconductor layer having the desired semiconductor characteristics according to factors such as an application of an organic transistor used in the present invention, and an organic semiconductor material used for a general organic semiconductor transistor can be used. As examples of such organic semiconductor material, a π-conjugated system aromatic compound, a chain compound, an organic pigment, an organic silicon compound can be cited. More specifically a pentacene-based, thiophene-based, perylene-based, and fullerene-based material can be cited as a low-molecular-based material, and polyalkylthiophene, polyphenylenevinylene, a copolymer of polyflorene and thiophene can be cited as a high-molecular-based material. The organic semiconductor material used in the present step may be a single kind or plural kinds.

A solvent used for the coating solution for forming an organic semiconductor layer is not particularly limited as long as the solvent can dissolve/decompose the desired amount of the organic semiconductor material according to a type of the organic semiconductor material. As examples of such solvent, toluene, xylene, tetralin, decalin, chloroform, monochlorobenzene, dichlorobenzene, trichlorobenzene can be cited.

The solvent may be of a single kind or plural kinds.

(2) Method of Forming an Organic Semiconductor Layer

Next, a method of forming an organic semiconductor layer in the present step will be explained. As a method of forming an organic semiconductor layer in the present step, a method of forming an organic semiconductor layer made of an organic semiconductor material on the lyophilic functional layer by selectively coating the coating solution for forming an organic semiconductor layer to the lyophilic functional layer formed in the step of forming a lyophilic functional layer is used.

In the present step, a method of selectively coating the coating solution for forming an organic semiconductor layer to the lyophilic functional layer is not particularly limited as long as a coating layer of the coating solution for forming an organic semiconductor layer is formed on the lyophilic functional layer. As such a method, a method such as an ink jet method, in which a coating solution is pattern coated directly, can be used. However, since the lyophilic functional layer has higher lyophilicity to an organic solvent used in the coating solution for forming an organic semiconductor layer than that of the hydrophobic layer used in the hydrophobic/hydrophilic pattern substrate, even if the coating solution for forming an organic semiconductor layer is coated to the entire surface of the hydrophobic/hydrophilic pattern substrate where the lyophilic functional layer is formed, it is still possible to form a coating layer of the coating solution for forming an organic semiconductor layer only on the lyophilic functional layer by utilizing the difference in lyophilicity. Thus, in the present step, it is preferable to coat the coating solution for forming an organic semiconductor layer to the hydrophobic/hydrophilic pattern substrate where the hydrophobic region and the lyophilic functional layer are formed, utilize the difference in affinity to an organic solvent between the hydrophobic region and the lyophilic functional layer, and form the organic semiconductor layer to the lyophilic functional layer. It is preferable to use a method of coating the entire surface of the hydrophobic/hydrophilic pattern substrate as the coating method of coating the coating solution for forming an organic semiconductor layer. As such coating method, general coating method such as a spin coating, a dye coating, a roll coating, a bar coating, a dip coating, a spray coating, a blade coating and gravure offset printing method can be used.

A thickness of the organic semiconductor layer formed in the present step is not particularly limited as long as it can exhibit the desired semiconductor characteristics according to factors such as a type of the organic semiconductor material. In particular, a thickness of the organic semiconductor layer formed in the present step is preferably within the range of 2 nm to 1 µm, more preferably within the range of 5 nm to 500 nm, and even more preferably within the range of 10 nm to 100 nm.

4. Method of Producing an Organic Transistor

A method of producing an organic transistor of the present invention comprises at least the step of forming a hydrophobic/hydrophilic pattern substrate and the step of forming a lyophilic functional layer, and the step of forming an organic semiconductor layer, and the method may further comprise an optional step(s) as needed. An optional step which may be included in the present invention is not particularly limited as long as it can provide the desired function to the organic transistor according to factors such as an application of an organic transistor produced in the present invention. In particular, in addition to the above-mentioned steps, steps such as a step of forming a gate electrode wherein a gate electrode is formed, a step of forming a gate insulating layer wherein a gate insulating layer is formed, and a step of forming source and drain electrodes wherein a source electrode and a drain electrode are formed, are suitably used in the method of producing an organic transistor of the present invention.

An embodiment of comprising the step of forming a gate electrode, the step of forming a gate insulating layer and the step of forming source and drain electrodes as the optional steps of the present invention will be explained with reference to the drawings. FIGS. 4A to 4E is a schematic view illustrating an embodiment of comprising these steps in the present invention. As shown in FIGS. 4A to 4E, the method of producing an organic transistor of the present invention comprises: a step of forming a hydrophobic/hydrophilic pattern substrate (FIG. 4B), a step of forming a lyophilic functional layer (FIG. 4C), a step of forming an organic semiconductor layer (FIG. 4D), and a step of forming source and drain electrodes. In the step of forming a hydrophobic/hydrophilic pattern substrate (FIG. 4B), a hydrophobic/hydrophilic pattern substrate 1 is produced by using, as a hydrophobic substrate, a substrate which comprises a hydrophilic substrate 1'a and a hydrophobic layer 1'b, wherein the hydrophilic substrate 1'a has an optional substrate 1", a gate electrode 4 formed on the substrate 1", and a gate insulating layer 5 formed on the gate electrode 4 and the surface thereof exhibits hydrophilicity (FIG. 4A), and wherein the hydrophobic layer 1'b is removed in pattern to produce the hydrophobic/hydrophilic pattern substrate 1. In the step of forming a lyophilic functional layer (FIG. 4C), a lyophilic functional layer 2 is formed on the surface of the gate insulating layer 5 which is the hydrophilic region. In the step of forming an organic semiconductor layer (FIG. 4D), an organic semiconductor layer 3 is formed on the lyophilic functional layer 2. In the step of forming source and drain electrodes, a source electrode 6 and a drain electrode 7 are formed on the organic semiconductor layer 3. Thereby, an organic transistor produced in the present invention is made to have a bottom gate type structure.

Further, FIGS. 5A to 5G is a schematic view illustrating another embodiment wherein the above-mentioned optional steps are used in the present invention. As shown in FIGS. 5A to 5G, the method of producing an organic transistor of the present invention comprises: a step of forming a hydrophobic/hydrophilic pattern substrate (FIG. 5B) wherein a hydrophobic/hydrophilic pattern substrate is produced by using a hydrophobic substrate 1' which comprises a hydrophilic substrate 1'a and a hydrophobic layer 1'b (FIG. 5A) and by removing the hydrophobic layer 1'b in pattern; a step of forming a lyophilic functional layer (FIG. 5C) wherein a lyophilic functional layer 2 is formed on the hydrophilic region of the hydrophobic/hydrophilic pattern substrate 1; a step of forming an organic semiconductor layer(FIG. 5D) wherein an organic semiconductor layer 3 is formed only on the lyophilic functional layer 2; a step of forming source and drain electrodes (FIG. 5E) wherein a source electrode 6 and a drain electrode 7 is formed on the organic semiconductor layer 3; a step of forming a gate insulating layer (FIG. 5F) wherein a gate insulating layer 5 is formed on the organic semiconductor layer 3; and a step of forming a gate electrode (FIG. 5G) wherein a gate electrode 4 is formed on the gate insulating layer 5. Thereby, an organic transistor produced in the present invention is made to have a top gate type structure.

As each of the above-mentioned step of forming a gate electrode, step of forming a gate insulating layer, and step of forming source and drain electrodes are similar to those generally used in producing an organic transistor, detailed explanation thereof are omitted.

5. Organic Transistor

An organic transistor produced in the present invention comprises: a hydrophobic/hydrophilic pattern substrate having a hydrophobic region and a hydrophilic region formed in pattern on a surface thereof, a lyophilic functional layer, made of an insulating functional material and having higher lyophilic properties to an organic solvent than that of the hydrophobic region, formed on the hydrophilic region, and an organic semiconductor layer made of an organic semiconductor material formed on the lyophilic functional layer. As such organic transistor will be explained in detail in the later section of "B. Organic Transistor", explanation here is omitted.

B. Organic Transistor

Next, an organic transistor of the present invention will be explained. As explained above, the organic transistor of the present invention comprises: a hydrophobic/hydrophilic pattern substrate having a hydrophobic region and a hydrophilic region formed in pattern on a surface thereof, a lyophilic functional layer, made of an insulating functional material and having higher lyophilic properties to an organic solvent than that of the hydrophobic region, formed on the hydrophilic region, and an organic semiconductor layer made of an organic semiconductor material formed on the lyophilic functional layer, wherein the insulating functional material has a function of improving semiconductor characteristics of the organic semiconductor layer and a property enabling selective provision to the hydrophilic region.

Figure 6:
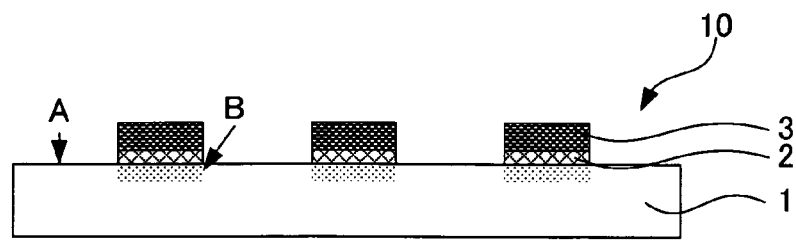
FIG. 6 is a cross-sectional view showing an embodiment of the organic transistor of the present invention.

Such organic transistor of the present invention will be explained with reference to the drawings. FIG. 6 is a cross-sectional view illustrating an embodiment of an organic transistor of the present invention. As shown in FIG. 6, an organic transistor 10 of the present invention comprises: a hydrophobic/hydrophilic pattern substrate 1 having a hydrophobic region A and a hydrophilic region B formed in pattern on the surface thereof; a lyophilic functional layer 2, made of an insulating functional material and having higher lyophilicity to an organic solvent than that of the hydrophobic region, formed on the hydrophilic region B; and an organic semiconductor layer 3 made of an organic semiconductor material formed on the lyophilic functional layer 2.

In such embodiment, the organic transistor 10 of the present invention is characterized in that the insulating functional material has a function of improving semiconductor characteristics of the organic semiconductor layer 3 and properties enabling selective provision to the hydrophilic region B.

In the present invention, as the organic semiconductor layer is formed on the lyophilic functional layer in pattern and the insulating functional material used for the lyophilic functional layer has a function of improving semiconductor characteristics of the organic semiconductor layer, an organic transistor excellent in transistor characteristics can be obtained resulting from the action of the lyophilic functional layer to the organic semiconductor layer.

Further, as the lyophilic functional layer has higher lyophilic properties to an organic solvent than that of the hydrophobic region of the hydrophobic/hydrophilic pattern substrate, an organic semiconductor layer can be selectively formed on the lyophilic functional layer when producing an organic transistor of the present invention. Still further, as the insulating functional material used for the lyophilic functional layer has properties enabling selective provision to the hydrophilic region of the hydrophobic/hydrophilic pattern substrate, it becomes easy to form the lyophilic functional layer only to the hydrophilic region when producing the organic transistor or the present invention. Thereby, an organic transistor which can be produced by simple processes is obtained in the present invention.

An organic transistor of the present invention comprises at least the above-mentioned hydrophobic/hydrophilic pattern substrate, lyophilic functional layer, organic semiconductor layer, and may have another structure as needed.

Hereinafter, each structure used in the organic transistor of the present invention will be explained in turn.

1. Hydrophobic/Hydrophilic Pattern Substrate

First, a hydrophobic/hydrophilic pattern substrate used in the present invention will be explained. The hydrophobic/hydrophilic pattern substrate used in the present invention is a substrate having a hydrophobic region and a hydrophilic region formed in a pattern on surface thereof.

The hydrophobic region and the hydrophilic region of the hydrophobic/hydrophilic pattern substrate used in the present invention is a region exhibiting hydrophobicity and a region exhibiting hydrophilicity, respectively. As definitions of the "hydrophobicity" and "hydrophilicity" herein are similar to those explained in the above-mentioned section "A. Method of Producing and Organic Transistor", explanations here are omitted.

The higher the hydrophobicity is, more preferable it is for the hydrophobic region of the present invention. More specifically, the hydrophobic region of the present invention has a contact angle to water at 25° C. of preferably 40° or higher, more preferably of 70° or higher and more preferably of 80° or higher. Further, the higher the hydrophilicity is, more preferable it is for the hydrophilic region of the present invention. More specifically, the hydrophilic region of the present invention has a contact angle to water at 25° C. of preferably 40° or smaller, more preferably of 30° or smaller and more preferably of 20° or smaller. Moreover, the bigger a difference in the contact angles between the hydrophilic region and the hydrophobic region is, more preferable it is for the present invention. More specifically, the difference in the contact angles between the hydrophilic region and the hydrophobic region is preferably 10° or higher, more preferably 40° or higher, and even more preferable 80° or higher. As a measuring method of the above-mentioned contact angle is similar to that explained in the above-mentioned section "A. Method of Producing an Organic Transistor", explanation here is omitted.

The hydrophobic/hydrophilic pattern substrate used in the present invention is not particularly limited as long as the substrate has a structure wherein a hydrophilic region having the desired hydrophilicity and a hydrophobic region having the desired hydrophobicity are formed in the desired pattern. As such hydrophobic/hydrophilic pattern substrate, an embodiment wherein the substrate has a structure in which a hydrophilic region is formed in the desired pattern on the substrate surface of a hydrophobic substrate made of a hydrophobic material (hydrophobic/hydrophilic pattern substrate of first embodiment), an embodiment wherein the substrate has a structure of comprising a hydrophilic substrate exhibiting hydrophilicity on a surface thereof and a hydrophobic layer exhibiting hydrophobicity formed on the hydrophilic substrate, and the hydrophobic layer is removed in pattern and the hydrophilic substrate surface is exposed in pattern (hydrophobic/hydrophilic pattern substrate of second embodiment), can be cited.

Hereinafter, a hydrophobic/hydrophilic pattern substrate of each embodiment will be explained.

Hydrophobic/Hydrophilic Pattern Substrate of First Embodiment

A hydrophobic/hydrophilic pattern substrate used in the first embodiment is not particularly limited as long as the substrate is made of a hydrophobic material which can exhibit the desired hydrophobicity. As a hydrophobic substrate similar to that explained in the above-mentioned section "A. Producing Method of an Organic Transistor" can be used for such hydrophobic substrate, and detailed explanation here is omitted.

Further, an embodiment wherein the hydrophilic region is formed on the hydrophobic substrate surface is not particularly limited as long as an embodiment exhibits the desired hydrophilicity. As such embodiment, those explained in the above-mentioned section "A. Producing Method of an Organic Transistor" can be used and detailed explanation here is omitted.

Hydrophobic/Hydrophilic Pattern Substrate of Second Embodiment

A hydrophobic/hydrophilic pattern substrate of the second embodiment comprises a hydrophilic substrate exhibiting hydrophilicity on a surface thereof and a hydrophobic layer exhibiting hydrophobicity formed on the hydrophilic substrate, and the hydrophobic layer is removed in pattern and the hydrophilic substrate surface is exposed in pattern. The hydrophilic substrate is not particularly limited as long as the surface thereof exhibits the desired hydrophilicity, and the hydrophobic layer is also not limited as long as the surface thereof exhibits the desired hydrophobicity. As the hydrophilic substrate and hydrophobic layer used in the hydrophobic/hydrophilic pattern substrate of the present embodiment are similar to those explained in the above-mentioned section "A. Producing Method of an Organic Transistor", detailed explanations here are omitted.

Further, the hydrophobic/hydrophilic pattern substrate of the present embodiment is a substrate wherein the hydrophilic region and the hydrophobic region are formed on the surface thereof by removing the hydrophobic layer in pattern and by exposing the hydrophilic substrate surface in pattern. Here, as an embodiment where the hydrophobic layer is removed in pattern is similar to that explained in the above-mentioned section "A. Producing Method of an Organic Transistor", explanation here is omitted.

(Other Structure)

The hydrophobic substrate used in the present step may be a substrate where a gate electrode and a gate insulating layer, or a source electrode and a drain electrode are formed according to a structure of an organic transistor produced by the present invention. Further, in a case when the gate insulating layer is formed and the surface of the gate insulating layer itself exhibits hydrophobicity, the hydrophobic/hydrophilic pattern substrate may be produced by conducting a hydrophilic treatment to the gate insulating layer surface.

2. Lyophilic Functional Layer

Next, a lyophilic functional layer used in the present invention will be explained. The lyophilic functional layer used in the present invention is characterized in that it is formed on the hydrophilic region of the hydrophobic/hydrophilic pattern substrate, made of an insulating functional material, and it has a higher lyophilicity to an organic solvent than that of the hydrophobic region. The lyophilic functional layer of the present invention is further characterized in that the insulating functional material has a function of improving semiconductor characteristics of the organic semiconductor layer to be explained later, and properties of enabling selective provision to the hydrophilic region.

3. Organic Semiconductor Layer

Next, an organic semiconductor layer used in the present invention will be explained. The organic semiconductor layer used in the present invention is characterized in that it is made of an organic semiconductor material and formed on the lyophilic functional layer.

An organic semiconductor material used in the organic semiconductor layer of the present invention is not particularly limited as long as the desired semiconductor characteristics are provided to the organic semiconductor layer. As such organic semiconductor material is similar to that explained in the above-mentioned section "A. Producing Method of an Organic Transistor", explanation here is omitted.

4. Organic Transistor

An organic transistor of the present invention comprises at least the above-mentioned hydrophobic/hydrophilic pattern substrate, lyophilic functional layer and organic semiconductor layer, and it may further comprise other optional structure as needed. As the optional structure which may be included in the present invention, a structure having the desired function can be optionally selected according to factors such as an application of an organic transistor produced in the present invention. In particular, a gate electrode, a gate insulating layer, a source electrode and a drain electrode are generally used as the optional structure for an organic transistor of the present invention.

Figure 7:
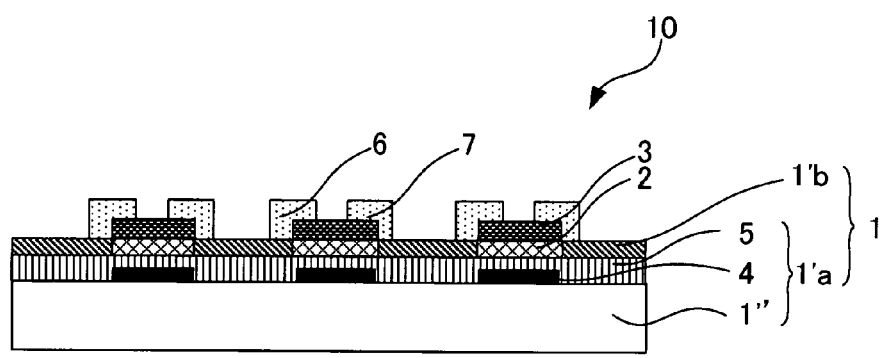
FIG. 7 is a cross-sectional view showing another embodiment of the organic transistor of the present invention.

An embodiment wherein a gate electrode, a gate insulating layer, a source electrode and a drain electrode are used in an organic transistor of the present invention will be explained with reference to the drawings. FIG. 7 is a cross-sectional view illustrating an embodiment where these optional members are used for an organic transistor of the present invention. As shown in FIG. 7, an organic transistor 10 of the present invention may comprise a hydrophobic/hydrophilic pattern substrate 1, in which a gate electrode 4 and a gate insulating layer 5 are formed, and a source electrode 6 and a drain electrode 7 formed on the organic semiconductor layer 3. In such organic transistor of the present invention, the organic transistor comes to have a bottom gate type transistor structure.

An embodiment where an organic transistor of the present invention has a bottom gate type transistor structure is not limited to the embodiment of FIG. 7, and the embodiment may be the one where a source electrode 6 and a drain electrode 7 are formed under the organic semiconductor layer 3.

Figure 8:
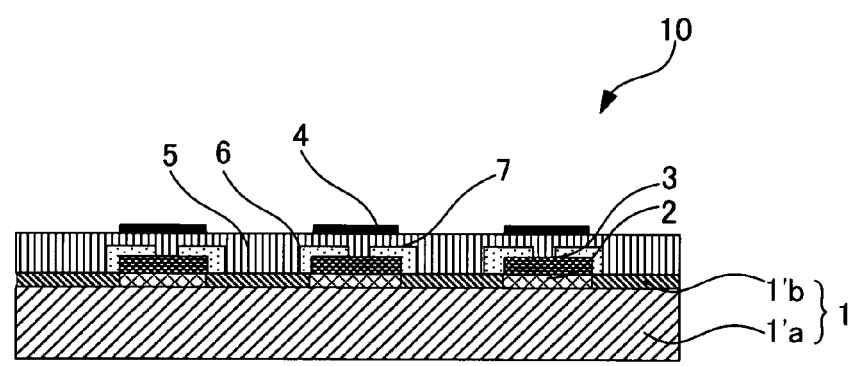
FIG. 8 is a cross-sectional view showing yet another embodiment of the organic transistor of the present invention.

FIG. 8 is a schematic cross-sectional view of another embodiment where these optional members are used in an organic transistor of the present invention. As shown in FIG. 8, an organic transistor 10 of the present invention may comprise a source electrode 6 and a drain electrode 7 formed on the organic semiconductor layer 3, and a gate insulating layer 5 and a gate electrode 4 are formed on the organic semiconductor layer 3. In such embodiment, an organic transistor of the present invention has a top gate type transistor structure.

The gate electrode is not particularly limited as long as it is made of a conductive material. As examples of the conductive material, a metal such as Al, Cr, Ni, Au, Ag, Ta, Cu, C, Pt and Ti, and a conductive high-molecular material such as PEDOT/PSS can be cited. Further, a source electrode and a drain electrode used in the present invention are not particularly limited as long as they are made of a conductive material. As examples of the conductive material, a metal and metal oxide material such as Al, Cr, Ni, Au, Ag, Ta, Cu, C, Pt, Ti, Nb, Mo, IZO, ITO, MoOx, NiOx, and TiOx, a conductive high-molecular material such as PEDOT/PSS can be cited. Moreover, the gate insulating layer is not particularly limited as long as it has the desired insulation properties and a gate insulating layer generally used in an organic transistor can be used.

5. Application of an Organic Transistor

An organic transistor of the present invention can be applied to a TFT-array substrate of a display device using a TFT system. As examples of such display device, liquid crystal display devices, electrophoresis display devices, and organic EL display devices can be cited. Further, by combining organic transistors, basic circuits (OR, AND, NOT, EXOR (EOR), NAND, NOR) or the like can be produced to produce logic circuits thereby.

6. Method of Producing an Organic Transistor

An organic transistor of the present invention can be produced by applying a generally-known producing method of an organic transistor. In particular, an organic transistor can be suitably produced by using the producing method explained in the above-mentioned section "B. Method of Producing an Organic Transistor".

The present invention is not limited to the embodiments. The embodiments are merely examples, and any embodiment having the substantially same configuration as the technological idea disclosed in the claims of the present invention and the same effects is included in the technological scope of the present invention.

EXAMPLES

Hereinafter, the present invention will be specifically explained by way of examples.

Example 1

An HMDS (hexamethyldisilazane) was formed on a silicon wafer with a thermally-oxidized film (50 nm) attached thereto and a hydrophobic layer is produced. Ultraviolet of wavelength of 185 nm was radiated through a metal mask having an opening for three minutes by using a device manufactured by SEN LIGHTS CORPORATION. By decomposing the HMDS in the opening, a hydrophilic region was obtained. The substrate was dipped into a chloroform fluid of PhTS (β-phenethyltrichlorosilane) and a PhTS monolayer was formed in the hydrophilic region as an insulating functional material. A toluene fluid of octyl quarter thiophene (8QT8) (0.3 wt %) was then coated on the substrate to evaporate the solvent, and an 8QT8 thin film was formed only in the hydrophilic region. Using a vacuum deposition device manufactured BY ULVAC, INC., a deposited film of Au was formed by 30 nm and an organic transistor (device 1) was produced.

Example 2

An OTS (octyl trichlorosilane) was formed on a silicon wafer with a thermally-oxidized film (100 nm) attached thereto and a hydrophobic layer is produced. Ultraviolet of wavelength of 172 nm was radiated through a metal mask having an opening for three minutes by using a device manufactured by USHIO INC. By decomposing the OTS in the opening, a hydrophilic region was obtained. The substrate was dipped into a toluene fluid of PTS (phenyltrichlorosilane) and PTS was formed in the hydrophilic region. A xylene solution of 8QT8 (0.05 wt %) was then coated on the substrate to evaporate the solvent, and an 8QT8 thin film was formed only in the hydrophilic region. Using a vacuum deposition device (manufactured by Science-Technology Co., Ltd.), a deposited film of Au was formed by 50 nm and an organic transistor (device 2) was produced.

Example 3

An ODTS (octadecyl trichlorosilane) was formed on a silicon wafer with a thermally-oxidized film (50 nm) attached thereto and a hydrophobic layer is produced. Ultraviolet of wavelength of 185 nm was radiated through a metal mask having an opening for three minutes by using a device manufactured by SEN LIGHTS CORPORATION. By decomposing the ODTS in the opening, a hydrophilic region was obtained. A solution of NMP (n-methylpyrrolidone) of polyimide was spin-coated onto the substrate under conditions of 5,000 spins and 40 seconds, and then burned under conditions of 180° C. for one hour to form a polyimide thin film of thickness of about 15 nm only in the hydrophilic region as an insulating functional material. Using a vacuum deposition device manufactured BY ULVAC, INC., a deposited film of Au was formed by 30 nm as a source and drain electrodes. A tetralin solution of 8QT8 (2 wt %) was then coated on the substrate to evaporate the solvent, and an 8QT8 thin film was formed only in the hydrophilic region to produce an organic transistor (device 3).

(Evaluation of Electric Properties of Organic Transistor Devices)

Evaluation of electric properties was carried out using a semiconductor parameter analyzer 4156C manufactured by Agilent Technologies, Inc. for the device 1, and a Keithley 237 and a Keithley 6487 manufactured by Agilent Technologies, Inc. for the devices 2 and 3 respectively.

In all devices, drain current modulation caused by a gate voltage at a certain drain voltage and drain current modulation caused by a drain voltage at a certain gate voltage were observed. It was confirmed that they were performing well as transistors.

Figure 9:
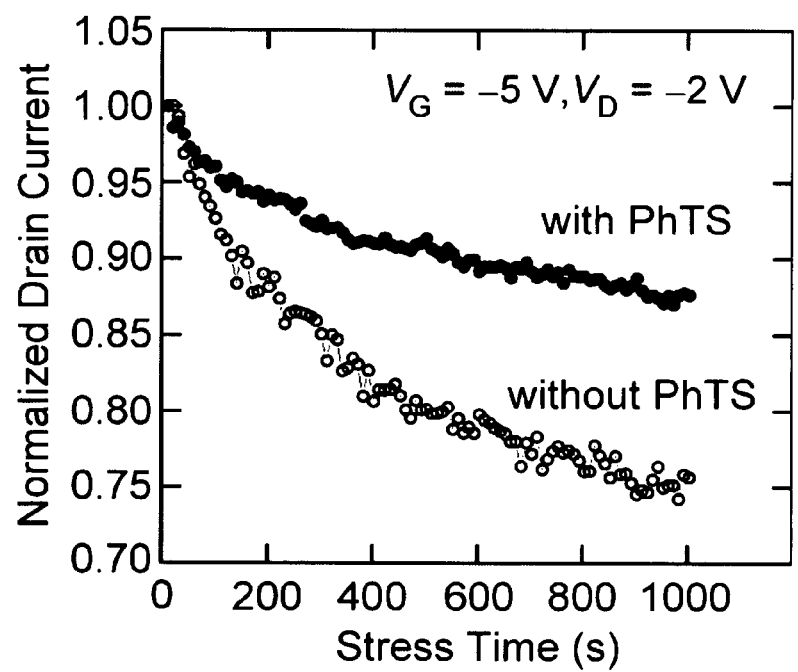
FIG. 9 is a graph showing time variation in drain current of an organic transistor of the present invention.

Bias stress characteristics tests were carried out to the devices 1 and 3 to compare their reliability with that of a separately-produced transistor having no lyophilic functional layer. The bias stress characteristics test is an evaluation method of reliability in which a certain gate voltage and drain voltage are applied continuously to observe time variation in drain current. Drain currents after 1,000 seconds of voltage application were 75%, 87% and 97.5% regarding a device having no lyophilic functional layer, devices 1 and 3, respectively. It was confirmed that the transistors having lyophilic functional layers have higher reliability compare to that of the organic transistor having no lyophilic functional layer. Time variation in drain current under bias stress for the device having no lyophilic functional layer and device 1 are shown in FIG. 9. As also shown in FIG. 9, reliability of the transistor was improved by comprising a lyophilic functional layer.

What is claimed is:

1. A method of producing an organic transistor comprising:
   forming a hydrophobic/hydrophilic pattern substrate, in which the hydrophobic/hydrophilic pattern substrate having a hydrophobic region and a hydrophilic region formed in pattern on a surface thereof is formed by using a hydrophobic substrate exhibiting hydrophobicity on a surface thereof and by forming the hydrophilic region in pattern on the hydrophobic surface;
   forming a lyophilic functional layer, in which the lyophilic functional layer, made of an insulating functional material and having higher lyophilic property to an organic solvent than that of the hydrophobic region, is formed on the hydrophilic region;
   forming an organic semiconductor layer, in which the organic semiconductor layer made of an organic semiconductor material is formed on the lyophilic functional layer by selectively coating a coating solution for forming an organic semiconductor layer, which comprises an organic semiconductor material and an organic solvent, to the lyophilic functional layer,
   wherein the insulating functional material has a function of improving a semiconductor characteristic of the organic semiconductor layer and a property enabling selective provision to the hydrophilic region in the step of forming a lyophilic functional layer.

2. The method of producing an organic transistor according to claim 1, wherein forming the organic semiconductor layer comprises: coating the coating solution for forming an organic semiconductor layer to the hydrophobic/hydrophilic pattern substrate having the hydrophobic region and the lyophilic functional layer formed, and forming the organic semiconductor layer on the lyophilic functional layer by utilizing a difference in affinity to an organic solvent between the hydrophobic region and the lyophilic functional layer.

3. The method of producing an organic transistor according to claim 1, wherein the hydrophobic substrate comprises:
   a hydrophilic substrate exhibiting hydrophilicity on a surface thereof, and
   a hydrophobic layer formed on the hydrophilic substrate and made of a self-assembled monolayer exhibiting hydrophobicity, and wherein forming the hydrophobic/hydrophilic pattern substrate comprises removing the hydrophobic layer in pattern and exposing the hydrophilic substrate surface in pattern.

4. The method of producing an organic transistor according to claim 1, wherein the insulating functional material has a function of improving a crystal property of the organic semiconductor material contained in the organic semiconductor layer.

5. An organic transistor comprising:

a hydrophobic/hydrophilic pattern substrate having a hydrophobic region and a hydrophilic region formed in pattern on a surface thereof, a lyophilic functional layer, made of an insulating functional material and having higher lyophilic property to an organic solvent than that of the hydrophobic region, formed on the hydrophilic region, and an organic semiconductor layer made of an organic semiconductor material formed on the lyophilic functional layer, wherein the insulating functional material has a function of improving a semiconductor characteristic of the organic semiconductor layer and a property enabling selective provision to the hydrophilic region of the hydrophobic/hydrophilic pattern substrate.

* * * * *